(12) United States Patent
Rawlings

(10) Patent No.: US 9,174,431 B2
(45) Date of Patent: Nov. 3, 2015

(54) PRINTING SCREEN

(71) Applicant: Architectural & Metal Systems Limited, County Cork (IE)

(72) Inventor: David Rawlings, Gloucestershire (GB)

(73) Assignee: Architectural & Metal Systems Limited, Little Island, County Cork (IE)

( * ) Notice: Subject to any disclaimer, the term of this patent is extended or adjusted under 35 U.S.C. 154(b) by 0 days.

(21) Appl. No.: 14/361,621

(22) PCT Filed: Nov. 14, 2012

(86) PCT No.: PCT/EP2012/072622
§ 371 (c)(1),
(2) Date: May 29, 2014

(87) PCT Pub. No.: WO2013/079325
PCT Pub. Date: Jun. 6, 2013

(65) Prior Publication Data
US 2014/0290510 A1    Oct. 2, 2014

(30) Foreign Application Priority Data

Nov. 29, 2011 (GB) .................................. 1120501.0

(51) Int. Cl.
*B41F 15/36* (2006.01)
*B41F 15/34* (2006.01)
(Continued)

(52) U.S. Cl.
CPC ................. *B41F 15/34* (2013.01); *B41F 15/36* (2013.01); *B41L 13/02* (2013.01); *B41N 1/248* (2013.01); *H05K 3/1216* (2013.01); *H05K 3/1225* (2013.01); *H05K 3/3484* (2013.01)

(58) Field of Classification Search
CPC .......... B41F 15/34; B41F 15/36; B41L 13/02; H05K 3/1216; H05K 3/1225

USPC ........... 101/127, 127.1, 128.1, 128.4; 38/102, 38/102.1, 102.8, 102.9
See application file for complete search history.

(56) References Cited

U.S. PATENT DOCUMENTS 8,069,783 B2 * 12/2011 Hall et al. .................. 101/127.1
8,342,089 B2 * 1/2013 Cane et al. ................. 101/127.1
(Continued)

FOREIGN PATENT DOCUMENTS

DE        20215298        2/2003
DE     102010028512      11/2011
(Continued)

OTHER PUBLICATIONS

Search Report for GB1120501.0 dated Mar. 15, 2012.
(Continued)

*Primary Examiner* — Blake A Tankersley
*Assistant Examiner* — Marissa Ferguson Samreth
(74) *Attorney, Agent, or Firm* — Andrus Intellectual Property Law, LLP

(57) ABSTRACT

A printing screen comprises a screen printing foil and a sub-frame component secured to an edge of the foil, wherein the foil is formed with cut-outs defining deflectable parts of the foil to be deflected out of the plane of the remainder thereof, and the sub-frame component comprises a fixed lip upon which part of the foil can be received, a recess into which the said deflectable parts of the foil can be deflected, and a moveable lip defining a series of spaced projections, the moveable lip being moveable to a position in which the projections bear against the deflectable parts of the foil, deflecting the deflectable parts into the recess to secure the foil to the sub-frame component.

10 Claims, 4 Drawing Sheets

(51) Int. Cl.
*B41L 13/02* (2006.01)
*H05K 3/12* (2006.01)
*B41N 1/24* (2006.01)
*H05K 3/34* (2006.01)

(56) References Cited

U.S. PATENT DOCUMENTS

| | | | |
|---|---|---|---|
| 8,430,027 B2 * | 4/2013 | Shaw et al. | 101/127.1 |
| 2009/0217831 A1 * | 9/2009 | Cane et al. | 101/126 |
| 2010/0300312 A1 | 12/2010 | Niswonger | |
| 2010/0307353 A1 * | 12/2010 | Willshere | 101/126 |
| 2012/0227597 A1 * | 9/2012 | Meeus et al. | 101/126 |

FOREIGN PATENT DOCUMENTS

| | | |
|---|---|---|
| GB | 2385827 | 9/2003 |
| GB | 2431899 | 5/2007 |
| GB | 2435011 | 8/2007 |
| JP | 9142053 | 6/1997 |

OTHER PUBLICATIONS

International Search Report for PCT/EP2012/072622 dated Jan. 30, 2013.

* cited by examiner

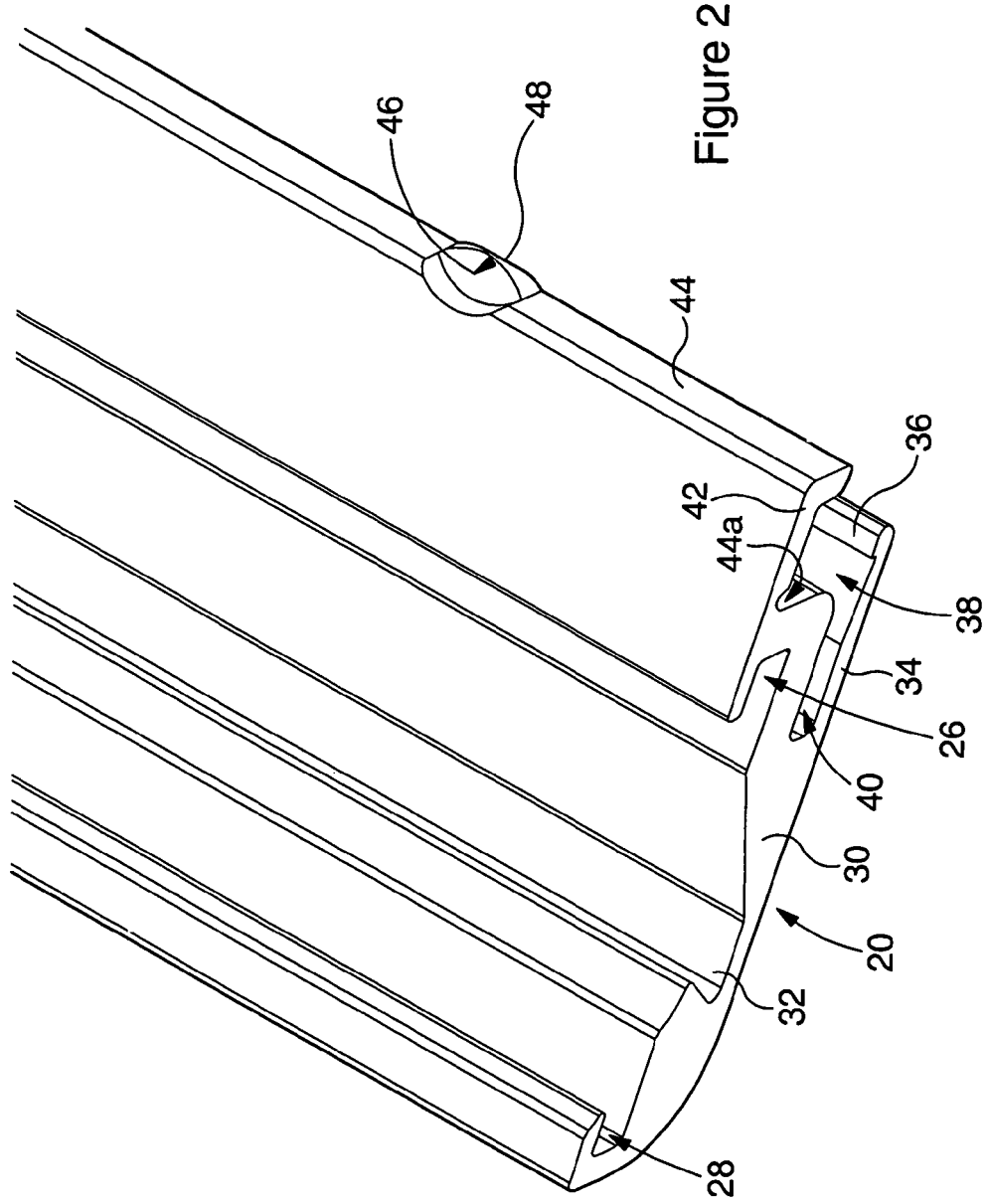

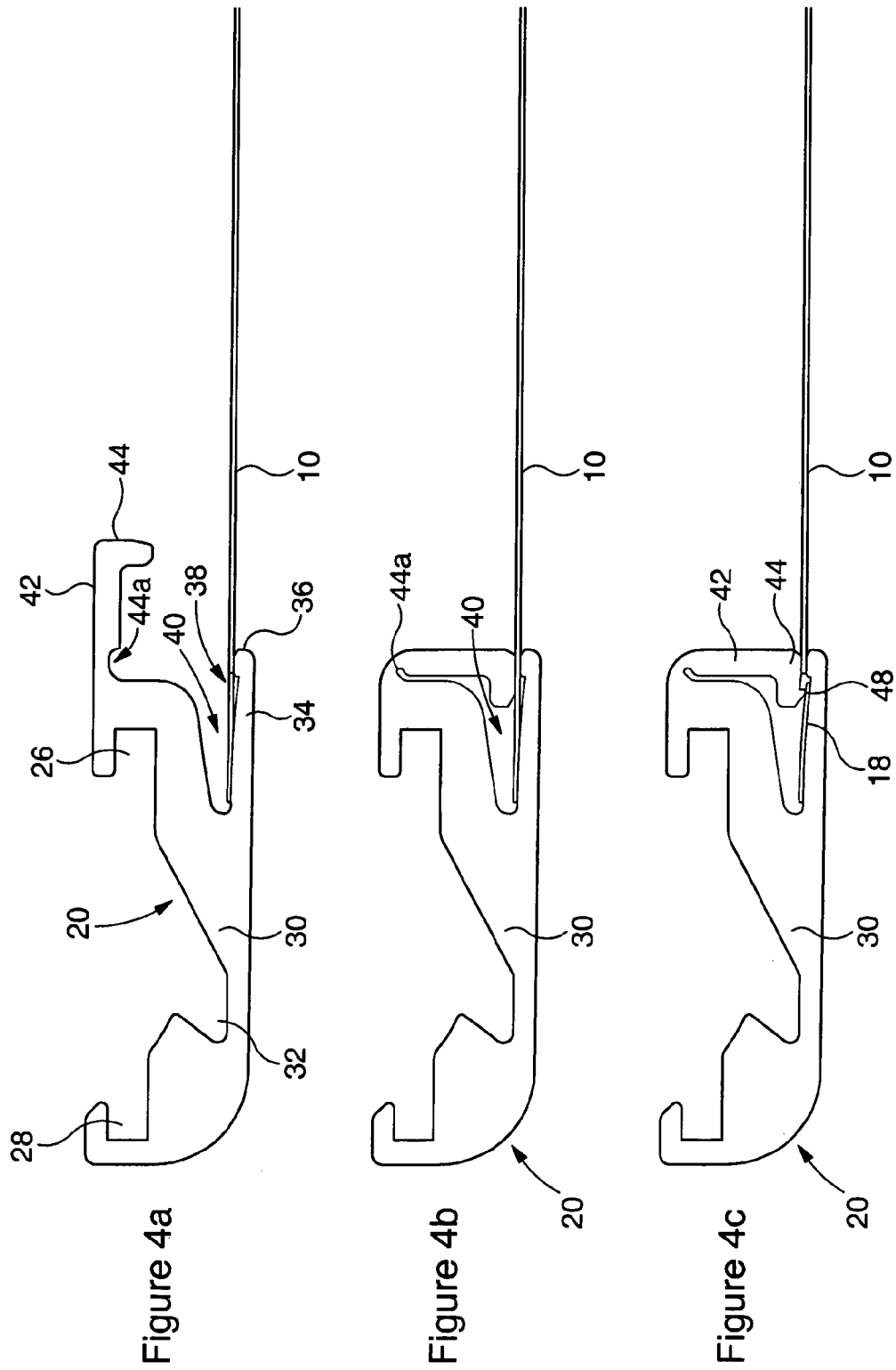

PRINTING SCREEN

CROSS REFERENCE TO RELATED APPLICATION

The present application is the U.S. national stage application of International Application PCT/EP2012/072622, filed Nov. 14, 2012, which international application was published on Jun. 6, 2013, as International Publication WO2013/079325. The International Application claims priority of British Patent Application 1120501.0, filed Nov. 29, 2011, the contents of which are incorporated herein by reference in their entireties.

BACKGROUND OF THE INVENTION

This invention relates to a printing screen, sometimes referred to as a stencil or mask, for example for use in the screen printing of electronic substrates such as circuit boards with conductive tracks or the like. Whilst one specific intended use of the invention is described, it will be appreciated that the invention may be used in a range of other applications.

In a known screen printing arrangement, a thin, stiff foil, for example of stainless steel form, has a series of openings formed or cut therein to form the apertures through which the fluid to be printed onto a substrate is delivered, in use. The fluid may comprise, for example, a solder paste. The manner in which the apertures are formed in the foil is not of relevance to the invention.

It is important to ensure that, in use, the foil is held under tension. In some arrangements this is achieved by permanently mounting the foil in a suitable tensioning frame. Whilst this achieves the desired effect of ensuring that the foil is under tension, the cost of providing each foil with its own tensioning frame is excessive. Furthermore, the space required to store each foil and associated tensioning frame is large. Rather than provide each foil with its own tensioning frame, arrangements are known in which the foil can be temporarily fitted into a tensioning frame when required, and can be removed therefrom after use. In order to allow the mounting or fitting of the foil to a tensioning frame, it is known to provide each foil with a sub-frame, secured to the periphery of the foil, the components of the sub-frame being designed in such a manner that they can cooperate with the tensioning frame so as to permit tensioning of the foil.

Techniques for securing a sub-frame to a foil are described in, for example, WO03093012. In that arrangement, the foil is formed along its edges with castellations which are folded back, out of the plane of the foil, and are located within, grooves formed in the sub-frame components.

Whilst the arrangements described in WO031093012 may operate successfully, an alternative, simple technique for attaching a screen printing foil to a sub-frame is desired.

SUMMARY OF THE INVENTION

According to the present invention there is provided a printing screen comprising a screen printing foil and a sub-frame component secured to an edge of the foil, wherein the foil is formed with cut-outs to allow deflectable parts of the foil to be deflected out of the plane of the remainder thereof, and the sub-frame component comprises a fixed lip upon which part of the foil can be received, a recess into which the said deflectable parts of the foil can be deflected, and a moveable lip defining a series of spaced projections, the moveable Up being moveable to a position in which the projections bear against the deflectable parts of the foil, deflecting the deflectable parts into the recess to secure the foil to the sub-frame component.

The cut-outs are conveniently of generally C-shaped form, formed at locations spaced inwards from the edges of the foil by a small distance.

The sub-frame component is conveniently of extruded form, for example being of extruded aluminium form. The projections may be formed by incomplete punching of an edge part of the sub-frame component. Alternatively, the projections may be formed by removal of parts of the movable lip.

The moveable lip is conveniently defined by an edge of a flange formed integrally on the sub-frame component and which can be moved relative to the remainder of the sub-frame component.

The sub-frame component preferably defines a projection cooperable, in use, with part of a tensioning frame to apply a tension to the foil.

The foil is conveniently of generally square or rectangular form, and preferably has sub-frame components secured adjacent each edge thereof. The sub-frame components are conveniently interconnected by corner pieces.

The invention will further be described, by way of example, with reference to the accompanying drawings, in which:

BRIEF DESCRIPTION OF THE DRAWINGS

FIG. 2 is a view to a much enlarged scale illustrating a section of a sub-frame component of the screen of FIG. 1;

FIGS. 4a, 4b and 4c illustrate how the foil and sub-frame component cooperate with one another.

DETAILED DESCRIPTION OF THE INVENTION

Figure 1:
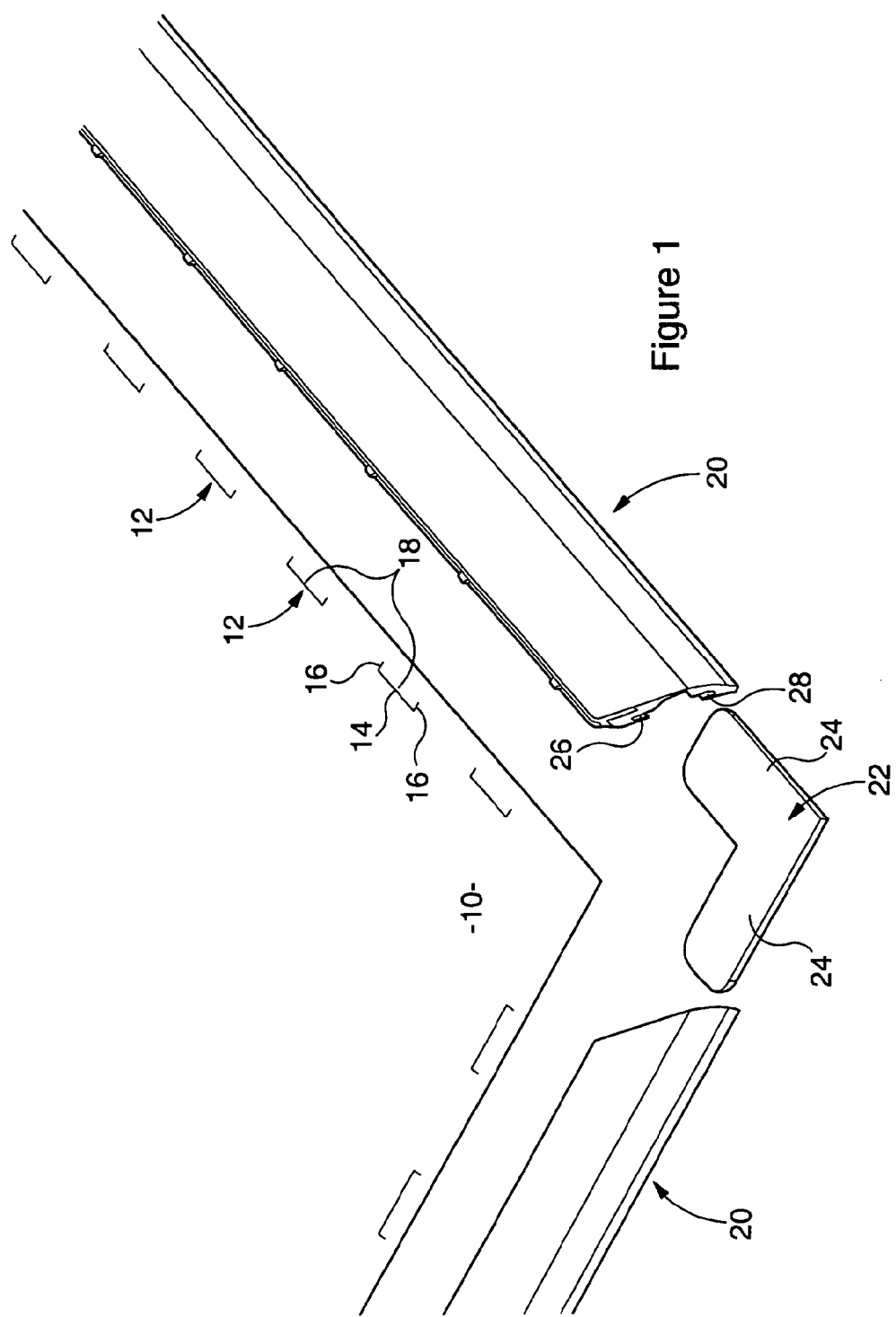
FIG. 1 illustrates part of a printing screen in accordance with an embodiment of the invention in exploded form.
Figure 3C:
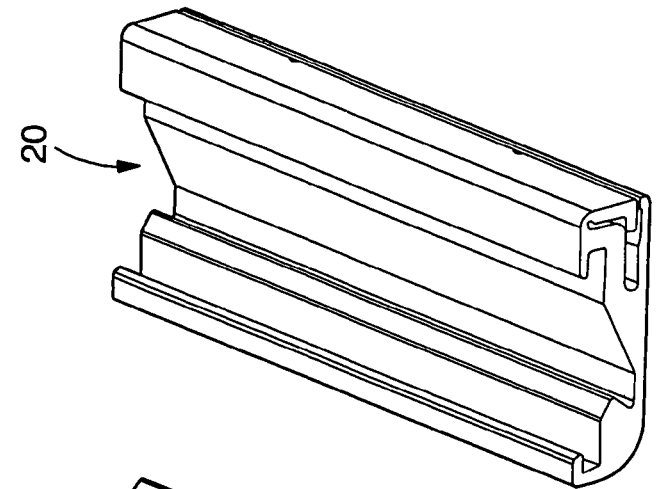
FIGS. 3a, 3b and 3c are further views illustrating part of the sub-frame component.
Figure 3B:
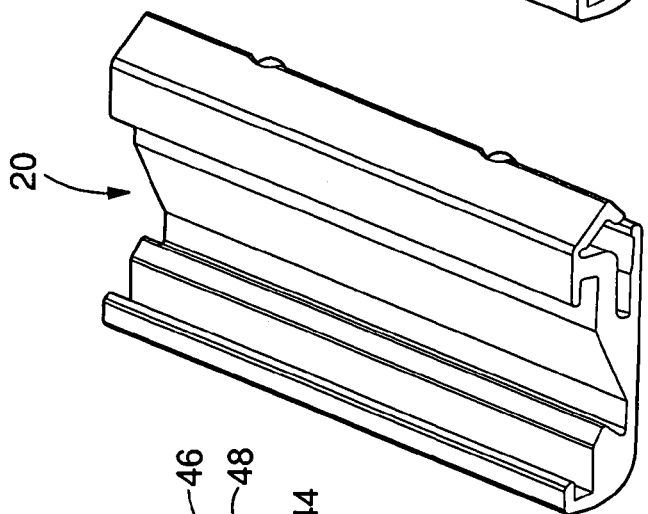
Figure 3A:
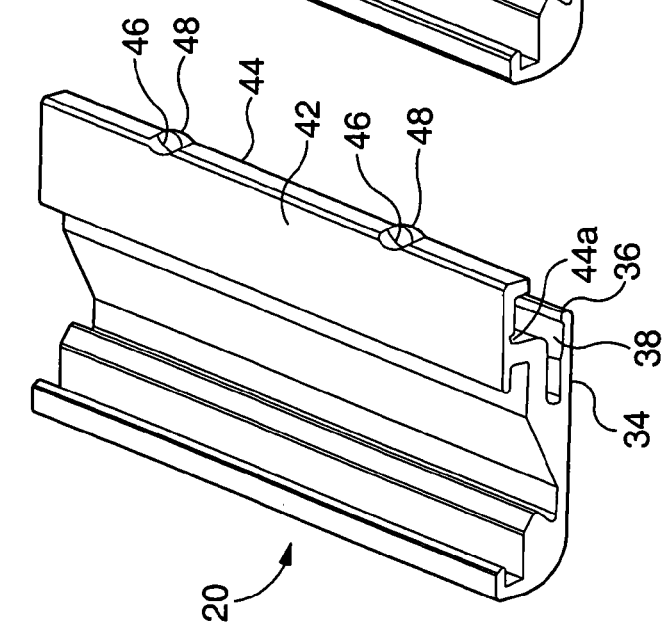

Referring firstly to FIG. 1, a printing screen is shown which comprises a thin stainless steel foil 10 of generally square or rectangular form. Although not shown, the foil 10 is formed with a series of printing apertures through which a fluid to be printed onto a substrate can be delivered in the traditional manner used in screen printing.

Adjacent the edges of the foil 10 are formed a series of generally C-shaped cut-outs 12. Each cut-out 12 thus takes the form of a base 14 and a pair of limbs 16, the limbs 16 extending from the ends of the base 14 towards the respective edge of the foil 10. Each cut-out 12 thus defines a deflectable part 18 of the foil 10 which is capable of being relatively easily deflected out of the plane of the remainder of the foil 10.

The printing screen further comprises four elongate sub-frame components 20 (only two of which are shown in FIG. 1). Each sub-frame component 20 is of extruded aluminium form, the sub-frame components 20 all being of the same cross-sectional shape. At their ends, the sub-frame components 20 are mitred such that butting of the ends of the sub-frame components 20 against one another results in the formation of a frame of generally the same shape as the foil 10. As illustrated, corner pieces 22 are provided, each corner piece 22 defining a pair of limbs 24 extending substantially perpendicularly to one another and receivable within recesses 26, 28 formed in the sub-frame components to assist in maintaining the sub-frame components 20 in position, particularly when the printing screen is not in use.

As best shown in FIGS. 4a, 4b and 4c, each sub-frame component 20 takes the form of a main body 30 from which extend projections defining the recesses 26, 28. In addition, the body 30 defines a pocket or recess 32 adapted to cooperate with a projection, typically a moveable projection, provided on a tensioning frame (not shown) to allow the sub-frame components 20 to be urged apart and thereby apply a tension to the foil 10, in use. The nature of the tensioning frame and manner by which it applied the tensioning load to the sub-frame components 20 is not of relevance to the invention and so will not be described in further detail.

Extending from the body 30 is a fixed limb 34 defining, at its end, a fixed lip 36. The limb 34 further defines an elongate channel or recess 38. A void 40 is formed between the fixed limb 34 and the body 30, the void 40 being capable of receiving the edge of the foil 10, in use.

Also extending from the body 30 is a moveable limb 42. The moveable limb 42 is formed integrally with the remainder of the sub-frame component 20, and is moveable by virtue of the formation of an elongate groove 44a which allows the moveable limb 42 to be moved between an extended position (see FIG. 4a) and an in use position (see FIGS. 4b and 4c). An end part of the moveable limb 42 defines a moveable lip 44 which, when the moveable limb 42 occupies its in use position, is positioned adjacent the fixed lip 36.

As shown in FIGS. 2 and 3a-3c, the moveable lip 44 is incompletely punched at intervals along the length thereof to form spaced recesses 46. The incomplete nature of the punching results in the material that is displaced in order to form the recesses 46 being displaced to form small projections 48, projecting from the moveable lip 44. The spacing of the projections 48 is substantially equal to the spacing of the cut-outs 12 formed in the foil.

In order to secure the foil 10 to each sub-frame component 20, prior to displacement of the moveable limb 42 to its in use position the edge of the foil 10 is inserted into the void 40 of the sub-frame component 20 with each cut-out 12 aligned with a respective one of the projections 48. Once correctly position, the sub-frame component 20 is deformed to move the moveable limb 44 from the position shown in FIGS. 3a and 4a, past that shown in FIG. 3b, to that shown in FIGS. 3c, 4b and 4c. Such movement results in the foil 10 being trapped between the fixed and moveable lips 36, 44 and in the spaced projections 48 bearing against the deflectable parts 18 of the foil 10 defined by the cut-outs 12, displacing the deflectable parts 18 into the groove 44 such that the cut edge of each deformable part 18 defined by the base 14 of the cut-out 12 is able to bear against an inner edge of the fixed lip 36. FIG. 4c illustrates a part of the screen at which one of the projections 48 and parts 18 are formed, FIG. 4b illustrating an intermediate part of the screen.

Once the printing screen is assembled in this manner, positioning of the printing screen in a tensioning frame to urge the opposing sub-frame components 20 apart results in a tensioning load being applied to the foil 10 via the sub-frame component 20, in particular the fixed limb 34 and fixed lip 36 thereof, and the deflectable parts 18 of the foil. Whilst the projections 48 serve to deflect the parts 18 into the groove 44, and maintain the parts 18 in their deflected positions, it will be appreciated that they do not serve to transmit the tensioning load.

Whilst in the arrangement shown the projections 48 are formed by incomplete punching, it will be appreciated that other techniques may be used. Such techniques include forming the sub-frame components with an elongate projection extending along the full length thereof, and machining away parts thereof to form discrete projections.

A wide range of modifications and alterations may be made to the arrangement described hereinbefore without departing from the scope of the invention.

The invention claimed is:

1. A printing screen comprising a screen printing foil and a sub-frame component secured to an edge of the foil, wherein the foil is formed with cut-outs to allow deflectable parts of the foil to be deflected out of the plane of the remainder thereof, and the sub-frame component comprises a fixed lip upon which part of the foil can be received, a recess into which the said deflectable parts of the foil can be deflected, and a moveable lip defining a series of spaced projections, the moveable lip being moveable to a position in which the projections bear against the deflectable parts of the foil, deflecting the deflectable parts into the recess to secure the foil to the sub-frame component.

2. The printing screen according to claim 1, wherein the cut-outs are of generally C-shaped form.

3. The printing screen according to claim 1, wherein the sub-frame component is of extruded form.

4. The printing screen according to claim 3, wherein the sub-frame component is of extruded aluminium form.

5. The printing screen according to claim 4, wherein the projections are formed by incomplete punching of an edge part of the sub-frame component.

6. The printing screen according to claim 4, wherein the projections are formed by removal of parts of the movable lip.

7. The printing screen according to claim 1, wherein the moveable lip is defined by an edge of a flange formed integrally on the sub-frame component and which can be moved relative to the remainder of the sub-frame component.

8. The printing screen according to claim 1, wherein the sub-frame component defines a projection cooperable, in use, with part of a tensioning frame to apply a tension to the foil.

9. The printing screen according to claim 1, wherein the foil is of generally square or rectangular form, and has sub-frame components secured adjacent each edge thereof.

10. The printing screen according to claim 9, wherein the sub-frame components are interconnected by corner pieces.

* * * * *